United States Patent
Kim et al.

(10) Patent No.: US 8,547,132 B2
(45) Date of Patent: Oct. 1, 2013

(54) CIRCUIT BOARD AND METHOD FOR TESTING COMPONENT BUILT IN THE CIRCUIT BOARD

(75) Inventors: Hyun Ho Kim, Gyeonggi-do (KR); Won Geun Jung, Chungcheongbuk-do (KR); Yul Kyo Chung, Gyeonggi-do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 427 days.

(21) Appl. No.: 12/870,347

(22) Filed: Aug. 27, 2010

(65) Prior Publication Data

US 2011/0273202 A1    Nov. 10, 2011

(30) Foreign Application Priority Data

May 10, 2010   (KR) .................. 10-2010-0043490

(51) Int. Cl.
*G01R 31/28* (2006.01)
(52) U.S. Cl.
USPC .................................... 324/763.01
(58) Field of Classification Search
None
See application file for complete search history.

(56) References Cited

U.S. PATENT DOCUMENTS

| | | | | |
|---|---|---|---|---|
| 7,345,366 B2 * | 3/2008 | Jow et al. | | 257/758 |
| 7,714,590 B2 * | 5/2010 | Jow et al. | | 324/537 |
| 2005/0122698 A1 | 6/2005 | Ho et al. | | |
| 2008/0047740 A1 * | 2/2008 | Lien et al. | | 174/256 |

FOREIGN PATENT DOCUMENTS

| | | |
|---|---|---|
| JP | 2002198630 A | 7/2002 |
| JP | 2006-237299 | 9/2006 |
| JP | 2007305674 A | 11/2007 |
| JP | 2009224576 A | 10/2009 |
| JP | 2009267267 A | 11/2009 |
| KR | 10-0769537 A | 10/2007 |
| KR | 1020090083071 A | 8/2009 |

* cited by examiner

*Primary Examiner* — Vinh Nguyen
(74) *Attorney, Agent, or Firm* — Lowe, Hauptman & Ham

(57) ABSTRACT

A circuit board includes an active device, a signal pad on a surface of the circuit board, at least one passive device electrically connecting the active device to the signal pad, and at least one test pad on the surface of the circuit board and electrically connected to a connection point between the active device and the at least one passive device. When a first passive device and a second passive device and a first test pad and a second test pad are provided, the first passive device and the second passive device are connected in series between the active device and the signal pad in this order, the first test pad is connected to a connection point between the active device and the first passive device, and the second test pad is connected to a connection point between the first passive device and the second passive device.

10 Claims, 5 Drawing Sheets

CIRCUIT BOARD AND METHOD FOR TESTING COMPONENT BUILT IN THE CIRCUIT BOARD

CROSS REFERENCE TO RELATED APPLICATION

This application claims the benefit of Korean Patent Application No. 10-2010-0043490, filed on May 10, 2010, entitled "Circuit board and method for testing component built in the circuit board", which is hereby incorporated by reference in its entirety into this application.

BACKGROUND OF THE INVENTION

1. Technical Field

The present invention relates to a circuit board and a method for testing components built in the circuit board, and more particularly, to a technology for testing a connection state of active/passive devices embedded inside the board.

2. Description of the Related Art

A circuit board means a plate on which an electronic circuit embedding and electrically inter-connecting various devices constituting the electronic circuit is formed. In general, active/passive devices embedded in the circuit board are built on a surface of the board using a surface mount technology (SMT). However, according to the recent trend of compacting electronic products, new packaging technologies embedding active/passive devices inside the board have been actively developed.

In the case of the circuit board using the embedded packaging technology, a plurality of devices are integrated inside the circuit board, having advantages in that electronic products can be miniaturized and manufacturing costs thereof can be reduced. However, it is very complicated to test a connection state of each device in the embedded board than in a board having devices embedded on the surface thereof.

SUMMARY OF THE INVENTION

An object of the present invention is to provide a board structure for testing a connection state of each device and a method for testing thereof in an embedded circuit board in which an active device and a passive device are embedded inside the board.

According to an exemplary embodiment of the present invention, there is provided a circuit board, including: an active device that is embedded inside the circuit board and includes at least one connection terminal; a passive device of which one terminal is electrically connected to one of the connection terminals of the active device and the other terminal is electrically connected to a signal pad on a surface of the circuit board; and a test pad that is electrically connected to the one terminal of the passive device.

At this time, the passive device may include one of a resistor, an inductor, and a capacitor.

Further, the test pad may be extended to an upper surface or a side surface of the circuit board.

Meanwhile, according to another exemplary embodiment of the present invention, there is provided a circuit board, including: an active device that is embedded inside the circuit board; at least one passive device that electrically connects the active device to a signal pad on a surface of the circuit board; and a test pad that is electrically connected to a connection point that electrically connects the active device to the passive device to be extended to the surface of the circuit board.

At this time, when the circuit board includes a plurality of passive devices, the test pad may be electrically connected to a connection point that electrically connects the active device to the passive devices to be extended to the surface of the circuit board, or may be electrically connected to a connection point that electrically connects the respective passive devices to be extended to the surface of the circuit board.

Further, the test pad may be extended to an upper surface or a side surface of the circuit board.

Meanwhile, according to an exemplary embodiment of the present invention, there is provided a method for testing a circuit board that includes an active device that includes at least one connection terminal and a passive device of which one terminal is electrically connected to one of the connection terminals of the active device and the other terminal is electrically connected to a signal pad on a surface of the circuit board, the method including: forming a test pad that is electrically connected to the one terminal of the passive device to be extended to the surface of the circuit board; testing a connection state of the active device using the signal pad or the test pad; and testing a connection state of the passive device using the signal pad or the test pad.

At this time, the testing the connection state of the active device may apply current having a predetermined magnitude to the active device through the signal pad or the test pad and measure current or voltage output from the active device The testing the connection state of the active device may apply current having a predetermined magnitude to the active device through the signal pad or the test pad when the passive device is a resistor or an inductor, and apply current having a predetermined magnitude to the active device using the test pad when the passive device is a capacitor.

Further, the testing the connection state of the passive device may apply current having a predetermined magnitude to an electrical path connected from the test pad to the signal pad via the passive device and measure voltage formed between the test pad and the signal pad when the current is applied.

DESCRIPTION OF THE PREFERRED EMBODIMENTS

Hereinafter, exemplary embodiments of the present invention will be described with reference to the accompanying drawings. However, the exemplary embodiments are described by way of examples only and the present invention is not limited thereto.

In describing the present invention, a detailed description of well-known technology relating to the present invention may unnecessarily make unclear the spirit of the present invention, the detailed description thereof will be omitted. Further, the following terminologies are defined in consideration of the functions in the present invention and may be construed in different ways by the intention of users and operators. Therefore, the definition should be made on the basis of the description of the specification. Therefore, the definitions thereof should be construed based on the contents throughout the specification.

As a result, the spirit of the present invention is determined by the claims and the following exemplary embodiments may be provided to efficiently describe the spirit of the present invention to those skilled in the art.

Meanwhile, in the following description, it should be noted that the meanings of "connected to" or 'coupled to' imply that two elements constituting an electronic circuit are electrically connected to each other.

Figure 1A:
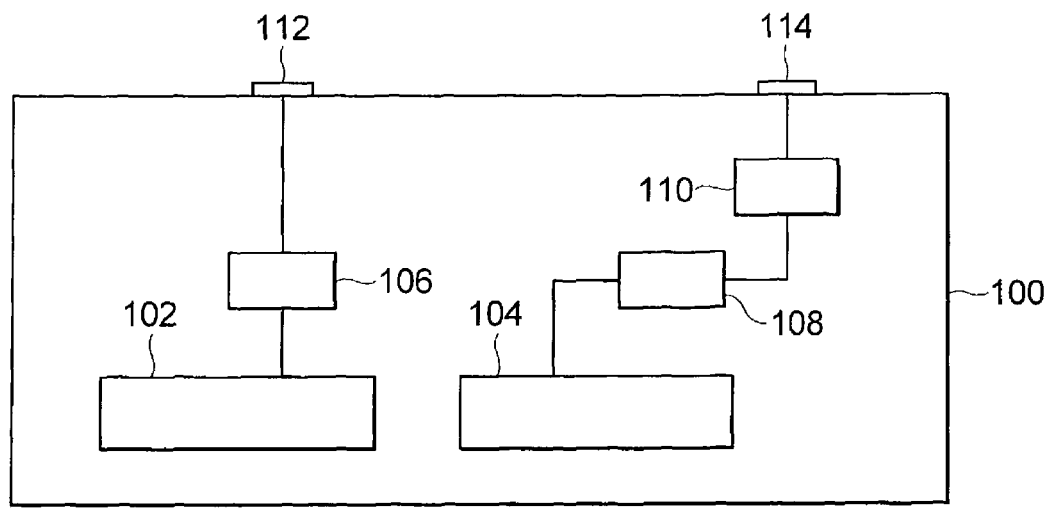
FIGS. 1A and 1B are cross-sectional views of a circuit board 100 according to an embodiment of the present invention.
Figure 1B:
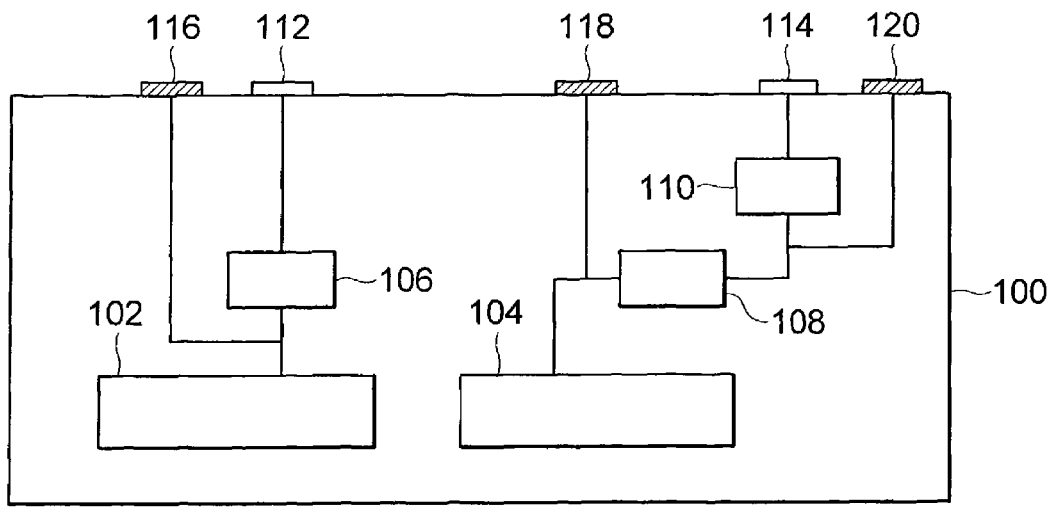

FIGS. 1A and 1B are cross-sectional views of a circuit board 100 according to an embodiment of the present invention. Among the figures, FIG. 1A shows a state before test pads 116, 118 and 120 are formed on the circuit board 100, and FIG. 1B shows a state after the test pads 116, 118 and 120 are formed on the circuit board 100, respectively.

As shown in the figures, the circuit board 100 according to an embodiment of the present invention includes at least one active device 102 and 104, at least one passive device 106, 108, and 110, signal pads 112 and 114, and test pads 116, 118 and 120.

The active devices 102 and 104 are embedded inside the circuit board 100 and include at least one connection terminal. The active devices 102 and 104 may be configured to include an OP amp, a relay, a diode, a transistor, or the like by way of example.

The passive devices 106, 108, and 110 mean a device such as a resistor, an inductor, a capacitor, or the like, and are embedded inside the circuit board 100 together with the active devices 102 and 104. At this time, among two terminals constituting the passive devices 106, 108, and 110, one terminal is connected to one of the connection terminals of the active devices 102 and 104 or another passive device, and the other terminal is connected to the signal pads 112 and 114 or another passive device. In other words, in the embodiment of the present invention, the respective active devices 102 and 104 are configured to be connected to the signal pads 112 and 114 through the at least one passive device 106, 108, and 110. In the embodiment shown in FIGS. 1A and 1B, one terminal of the passive device 106 is connected to the active device 102 and the other terminal thereof is connected to the signal pad 112. In addition, one terminal of the passive device 108 is connected to the active device 104 and the other terminal thereof is connected to the passive device 110, and one terminal of the passive device 110 is connected to the passive device 108 and the other terminal thereof is connected to the signal pad 114.

The signal pads 112 and 114 are provided on the surface of the circuit board 100, and provide conductive points that the circuit including the active devices 102 and 104 and the passive devices 106, 108, and 110 is electrically connected to the outside.

The test pads 116, 118, and 120 are pads for testing a connection state of each element constituting the circuit, that is, the active devices 102 and 104 and the passive devices 106, 108, and 110. The test pads 116, 118, and 120 may be provided on the surface of the circuit board 100, for example, the upper surface or the side surface of the circuit board 100. In addition, the test pads 116, 118, and 120 may be electrically connected to the connection points between the active devices 102 and 104 and the passive devices 106, 108, and 110, or may be electrically connected to the connection points connecting the respective passive devices 106, 108, and 110. In the embodiment shown in FIG. 1, the test pad 116 is connected to the connection point between the active device 102 and the passive device 106, the test pad 118 is connected to the connection point between the active device 104 and the passive device 108, and the test pad 120 is connected to the connection point between the passive device 108 and the passive device 110.

Figure 2:
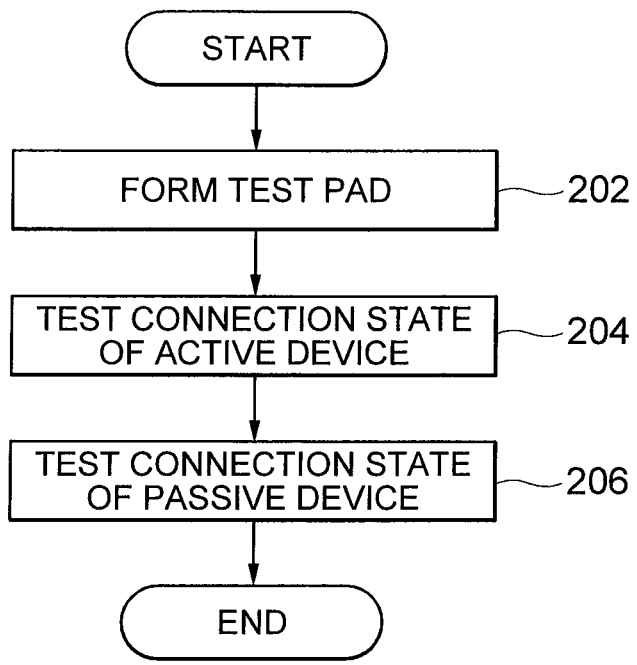
FIG. 2 is a flow chart showing a method for testing a circuit board 200 according to an embodiment of the present invention.

FIG. 2 is a flow chart showing a method for testing a circuit board 200 according to an embodiment of the present invention. Hereinafter, the method for testing the circuit board 200 will be described based on the circuit board 100 shown in FIGS. 1A and 1B by way of example.

The method for testing the circuit board 200 according to an embodiment of the present invention to be described below may also be performed in a manufacturing apparatus of the circuit board or a separate circuit board test apparatus by way of example.

First, the test pads 116, 118, and 120 for testing are formed in the circuit board 100 of FIG. 1A (202). As described above, the test pads 116, 118, and 120 may be configured to be extended from the connection points between the active devices and the passive devices or the connection points between the respective passive devices to the surface of the circuit board 100.

Next, the connection state of the active devices 102 and 104 in the circuit board 100 is tested using the signal pads 112 and 114 or the test pads 116, 118, and 120 (204). The connection state of the active devices 102 and 104 can be tested by applying current having a predetermined magnitude to the active devices 102 and 104 through the signal pads 112 and 114 or the test pads 116, 118, and 120 and measuring current or voltage output from the active devices 102 and 104. For example, in the case of the active device 102, current may be applied through the signal pad 112 or the test pad 116, and in the case of the active device 104, current having a predetermined magnitude may be applied through the signal pad 114 or the test pads 118 and 120. Whether the current is applied using which terminal of the signal pads 112 and 114 or the test pads 116, 118, and 120 may be properly selected according to the type of the active devices 102 and 104 or the passive devices 106, 108, and 110. For example, when the passive devices 106, 108, and 110 are capacitors, both end terminals of the passive devices 106, 108, and 110 are short-circuited, such that the active devices 102 and 104 are tested through the test pads 116 and 118 that are directly connected to the active devices 102 and 104. However, when the passive devices 106, 108, and 110 are resistors or inductors, the connection state of the active devices 102 and 104 can be confirmed even though which terminals of the signal pads 112 and 114 or the test pads 116, 118, and 120 are used.

Finally, the connection state of the passive devices 106, 108, and 110 in the circuit board 100 is tested using the signal pads 112 and 114 or the test pads 116, 118, and 120 (206). The connection state of the passive devices 106, 108, and 110 can be tested by applying current having a predetermined magnitude to the passive devices 106, 108, and 110 using the signal pads 112 and 114 or the test pads 116, 118, and 120 connected to both terminals of the corresponding passive devices 106, 108, and 110 and measuring voltage formed between the test pads 116, 118, and 120 and the signal pads 112 and 114 when the current is applied. For example, in the case of the passive device 106, it can be determined whether the electrical path connecting the signal pad 112, the passive device 106, and the test pad 116 is normally connected by applying current to both terminals of the signal pad 112 and the test pad 116. In addition, in the case of the passive device 108, current is applied between the test pad 118 and the test pad 120, and in the case of the passive device 110, current is applied between the signal pad 114 and the test pad 120, thereby making it possible to test each passive device.

The circuit board 100 according to an embodiment of the present invention is described by way of example only, such that specific coupling shapes of the respective elements of the circuit board 100 may vary according to the type of the circuit board 100. Hereinafter, the shape of the circuit board 100 and the method for testing the same 200 according to an embodiment of the present invention will be described through various examples.

Figure 3:
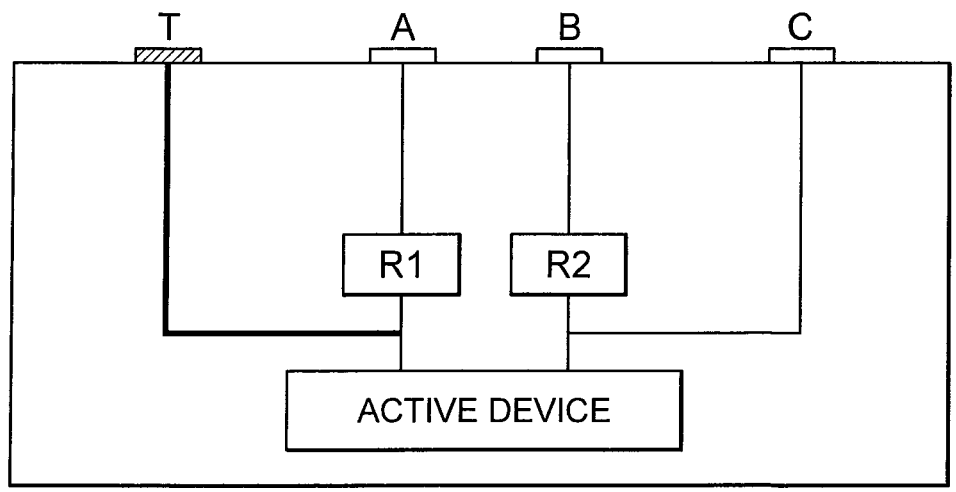
FIG. 3 shows a circuit board according to another embodiment.

First, the disposition of the test pads on the circuit board connected as shown in FIG. 3 and the method for testing each device will be described. FIG. 3 shows a shape in which one active device and two resistors R1 and R2 are embedded inside the circuit board. One terminal of each of R1 and R2 is connected to different terminals of the active devices and the other terminal thereof is connected to signal pads A and B, respectively. Apart therefrom, the terminal of the active device that is connected to R2 is connected to the outside of the circuit board through a signal pad C.

In the case of the circuit board having such a shape, a test pad T is connected to a connection point between R1 and the active device so as to test the circuit board. In the case of the connection point between R2 and the active device, the signal pad C functions as the test pad, such that no separate test pad is required to be connected. In other words, the test pad in the present invention means the terminal substantially functions as the test pad, such as the signal pad C, as well as the test pad separately connected, such as T as shown in FIG. 3.

In the circuit board having the shape as shown in FIG. 3, the connection state of the terminal of the active device that is connected to R1 can be tested by applying current having a predetermined magnitude to the signal pad A or the test pad T and measuring voltage or current output from the active device. Of course, even though the resistor R1 is connected between the signal pad A and the active device, current applied through the resistor is generally constant, such that the active device can be tested even though the resistor is connected. Likewise, the connection state of the terminal of the active device that is connected to R2 can be tested by applying current having a predetermined magnitude to the signal pad B or the signal pad C and measuring voltage or current output from the active device.

Next, the connection state of the passive device R1 can be tested by applying current having a predetermined magnitude to the electrical path connecting the signal pad A, the resistor R1, and the test pad T, and measuring voltage applied to both terminals of the signal pad A and the test pad T. Further, the connection state of the passive device R2 can be tested by applying current having a predetermined magnitude to the electrical path connecting the signal pad B, the resistor R2, and the signal pad C, and measuring voltage applied to both terminals of the signal pad B and the signal pad C.

Figure 4:
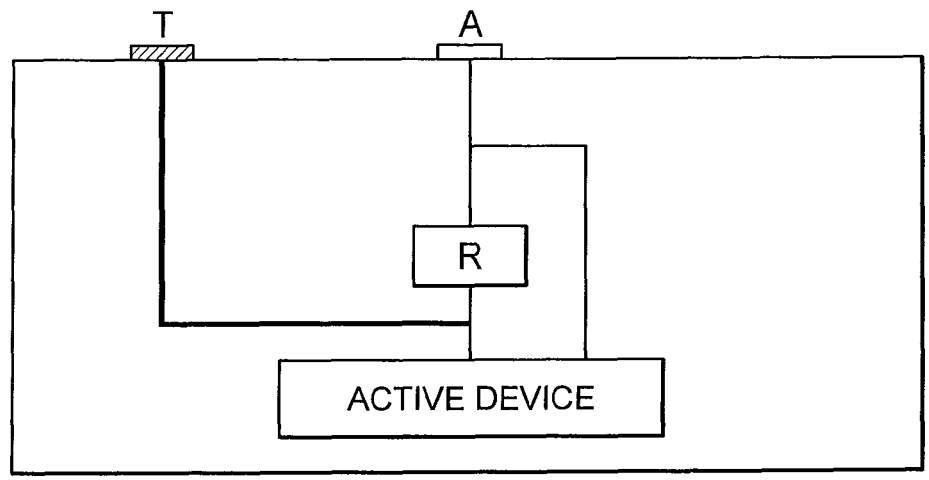
FIG. 4 shows a circuit board according to another embodiment.

Next, the disposition of the test pads on the circuit board connected as shown in FIG. 4 and the method for testing each device will be described. FIG. 4 shows a shape in which one active device and one resistor R are embedded inside the circuit board. One terminal of the active device is connected to the signal pad A through R, and the signal pad A is directly connected to the other terminal of the active device, not passing through R.

In the case of the circuit board having such a shape, the test pad T is connected to the connection point (terminal M) between R and the active device so as to test the circuit board. In this case, the connection state of the active device can be tested by applying current having a predetermined magnitude to the signal pad A or the test pad T and measuring voltage or current output from the active device. Next, the connection state of the passive device R can be tested by applying current having a predetermined magnitude to the electrical path connecting the signal pad A, the resistor R, and the test pad T, and measuring voltage applied to both terminals of the signal pad A and the test pad T.

Figure 5:
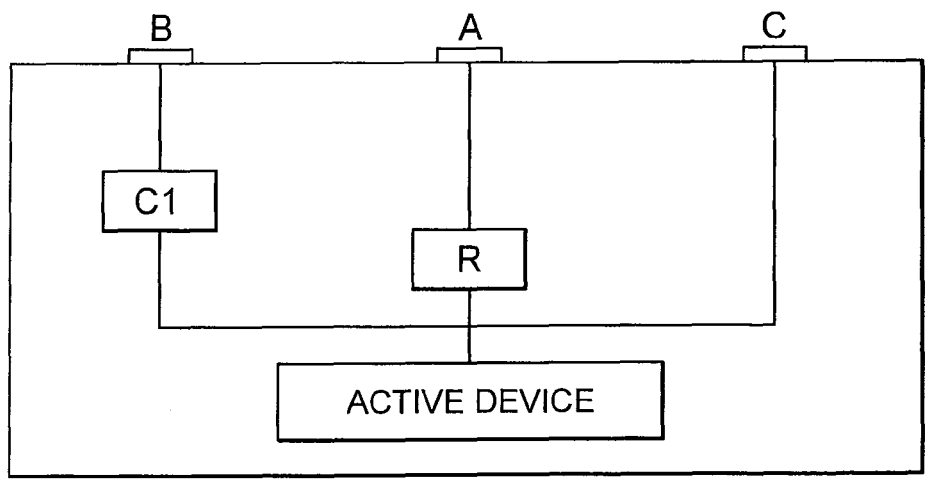
FIG. 5 shows a circuit board according to another embodiment.

Next, the disposition of the test pads on the circuit board connected as shown in FIG. 5 and the method for testing each device will be described. FIG. 5 shows a shape in which an active device, resistor R, and a capacitor C1 are embedded inside the circuit board One terminal of the active device is connected to the signal pad A through R and is connected to the signal pad C without passing through a separate passive device, while simultaneously being connected to the signal pad B through C1.

In the case of the circuit board having such a shape, the signal pad C functions as a test pad, such that no separate test pad is required to be added. In this case, the connection state of the active device can be tested by applying current having a predetermined magnitude to the signal pad A or the signal pad C and measuring voltage or current output from the active device. In the case of the signal pad B, however, the capacitor is connected to the midpoint thereof, such that the connection state of the active device cannot be tested through the signal pad B.

Next, the connection state of the passive device R can be tested by measuring the resistance value on the electrical path connecting the signal pad A, the resistor R, and the signal pad C. The connection state of the passive device C can be tested by measuring the capacitance on the electrical path connecting the signal pad B, the capacitor C1, and the signal pad C.

Figure 6A:
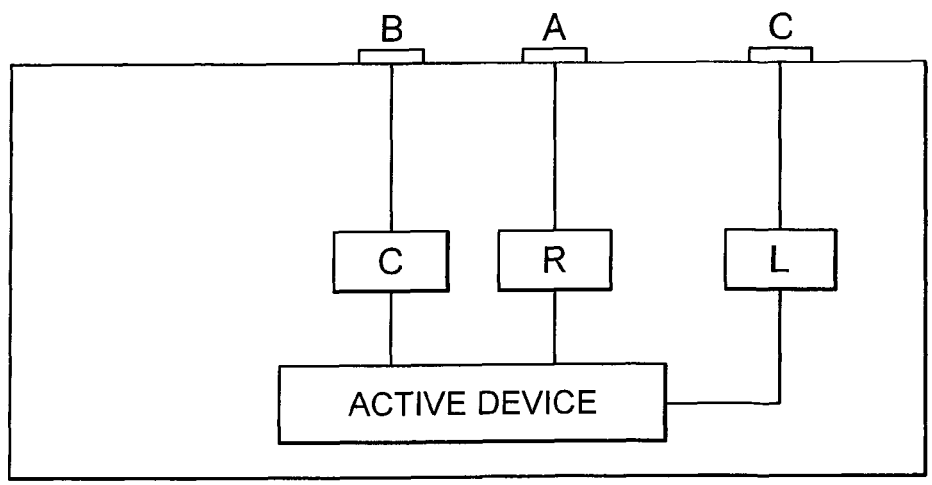
FIG. 6A shows a circuit board according to another embodiment.
Figure 6B:
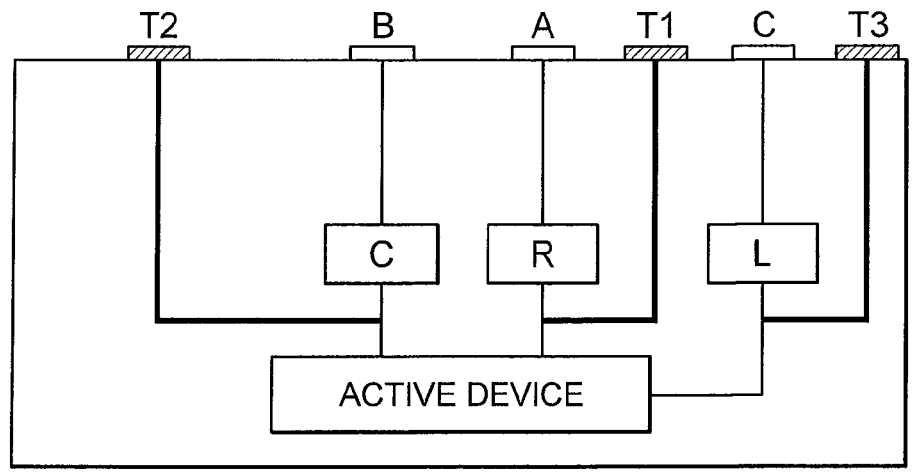
FIG. 6B shows a circuit board according to another embodiment.

Next, the disposition of the test pads on the circuit board connected as shown in FIGS. 6A and 6B and the method for testing each device will be described. FIG. 6A shows a cross-sectional view of the circuit board before test pads T1, T2, and T3 are formed, and FIG. 6B shows a cross-sectional view of the circuit board after the test pads T1, T2, and T3 are formed. As shown in the figures, the respective terminals of the active device are connected to the signal pads A, B, and C, respectively, through a resistor R, a capacitor C, and an inductor L.

In the case of the circuit board having such a shape, the test pad T1 is connected to the connection point between the resistor R and the active device, the test pad T2 is connected to the connection point between the capacitor C and the active device, and the test pad T3 is connected to the connection point between the inductor L and the active device. In this case, the connection state of the respective terminals of the active device can be tested through the signal pad A or the test pad T1, and through the signal pad C or the test pad T3. In the case of the terminal that is connected to the capacitor C, however, it can be tested through the test pad T2 only.

Next, the connection state of the passive device R can be tested by measuring the resistance value on the electrical path connecting the signal pad A, the resistor R, and the test pad T1. The connection state of the passive device C can be tested by measuring the capacitance on the electrical path connecting the signal pad B, the capacitor C, and the test pad T2. The connection state of the passive device L can be tested by measuring the capacitance on the electrical path connecting the signal pad C, the inductor L, and the test pad T3.

Figure 7:
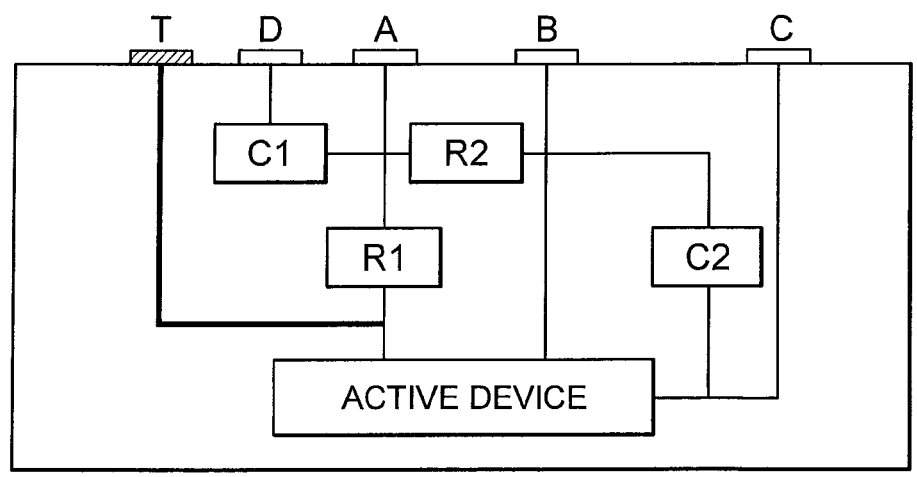
FIG. 7 shows a circuit board according to another embodiment.

Next, the disposition of the test pads on the circuit board connected as shown in FIG. 7 and the method for testing each device will be described. In the circuit board shown in FIG. 7, the test pad T is connected to the connection point between the active device and the resistor R1.

In the circuit board, the connection state of the active device can be tested using the signal pad A (or the test pad T), the signal pad B, and the signal pad C.

Next, the connection state of the passive device R1 can be tested by measuring the resistance value on the electrical path connecting the signal pad A, the resistor R1, and the test pad T. The connection state of the passive device R2 can be tested by measuring the resistance value on the electrical path connecting the signal pad A, a resistor R2, and the signal pad B. The connection state of the passive device C1 can be tested by measuring the capacitance on the electrical path connecting the signal pad A, the capacitor C1, and the signal pad D. The connection state of the passive device C2 can be tested by measuring the capacitance on the electrical path connecting the signal pad B, the capacitor C2, and the signal pad C.

Figure 8:
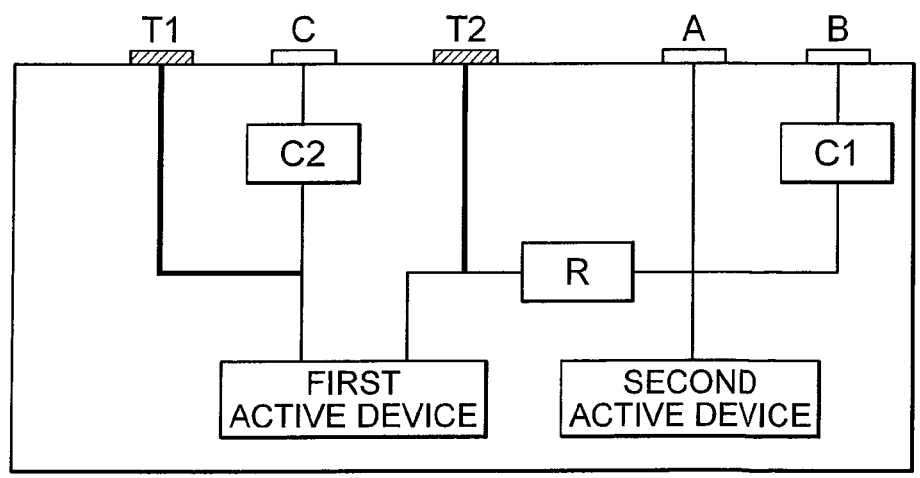
FIG. 8 shows a circuit board according to another embodiment.

Next, the disposition of the test pads on the circuit board connected as shown in FIG. 8 and the method for testing each device will be described. In the circuit board shown in FIG. 8, the test pad T1 is connected to the connection point between the first active device and the capacitor C2, and the test pad T2 is connected to the connection point between a first active device and the resistor R.

In the circuit board, the connection state of the first active device and the second active device can be tested using the signal pad A, the test pad T1, and the test pad T2. As described above, in the case of the signal pad B and the signal pad C, they are connected to the capacitors, such that the active devices cannot be tested using the terminals.

Next, the connection state of the passive device R can be tested by measuring the resistance value on the electrical path connecting the signal pad A, the resistor R, and the test pad T2. The connection state of the passive device C1 can be tested by measuring the capacitance on the electrical path connecting the signal pad A, the capacitor C1, and the signal pad B. The connection state of the passive device C2 can be tested by measuring the capacitance on the electrical path connecting the signal pad C, the capacitor C2, and the test pad T1.

Figure 9:
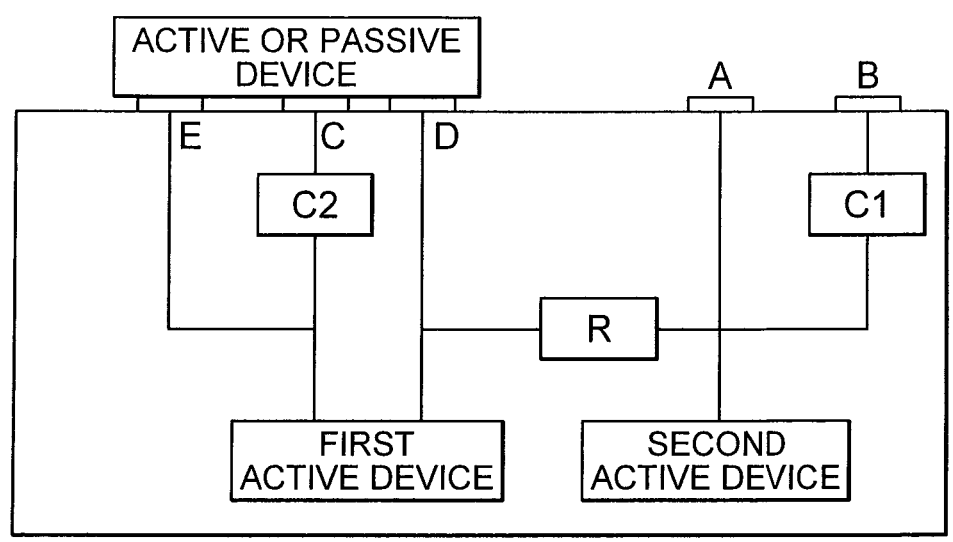
FIG. 9 shows a circuit board according to another embodiment.

Next, the disposition of the test pads on the circuit board connected as shown in FIG. 9 and the method for testing each device will be described. FIG. 9 shows a shape in which the active or passive device is embedded on the upper surface of the circuit board through the pad C, the pad D, and the pad E, using a SMT. In other words, the pad C, the pad D, and the pad E do not use a general signal pad but uses a SMT pad.

Even though the present invention uses such a SMT pad, it is possible to test the devices inside the circuit board in the same method as described above.

First, in the circuit board, the connection state of the first active device and the second active device can be tested using the signal pad A, the signal pad D, and the signal pad E. As described above, in the case of the signal pad B and the signal pad C, they are connected to the capacitors, such that the active devices cannot be tested using the terminals.

Next, the connection state of the passive device R can be tested by measuring the resistance value on the electrical path connecting the signal pad A, the resistor R, and the signal pad D. In addition, the connection state of the passive device C1 can be tested by measuring the capacitance on the electrical path connecting the signal pad A, the capacitor C1, and the signal pad B. The connection state of the passive device C2 can be tested by measuring the capacitance on the electrical path connecting the signal pad C, the capacitor C2, and the signal pad E.

According to the present invention, even when the active devices and the passive devices are embedded inside the board, it is possible to effectively test a connection state of each device, thereby making it possible to easily determine whether defects occur in the circuit board.

Although the exemplary embodiments of the present invention have been disclosed for illustrative purposes, those skilled in the art will appreciate that various modifications, additions and substitutions are possible, without departing from the scope and spirit of the invention as disclosed in the accompanying claims.

Accordingly, the scope of the present invention is not construed as being limited to the described embodiments but is defined by the appended claims as well as equivalents thereto.

What is claimed is:

1. A circuit board, comprising:
   an active device that is embedded inside the circuit board;
   a plurality of signal pads provided on a surface of the circuit board, the plurality of signal pads including at least a first signal pad and a second signal pad;
   a plurality of passive devices that electrically connects the active device and the plurality of signal pads on the surface of the circuit board; and
   a test pad that is electrically connected to a connection point that electrically connects the active device to one of the passive devices to be extended to the surface of the circuit board,
   wherein at least two of the passive devices or a group of the passive devices and the active device are provided between the first signal pad and the second signal pad or between the test pad and one of the plurality of signal pads.

2. The circuit board according to claim 1, wherein the test pad is electrically connected to a connection point that electrically connects the active device to the passive devices to be extended to the surface of the circuit board, or is electrically connected to a connection point that electrically connects the respective passive devices to be extended to the surface of the circuit board.

3. The circuit board according to claim 2, wherein the test pad is on an upper surface, which is the surface provided with the plurality of signal pads, or a side surface of the circuit board.

4. The circuit board according to claim 1, wherein
   the active device includes any one of an operational amplifier, a relay, a diode, or a transistor embedded inside the circuit board, and
   the passive device includes any one of a resistor, an inductor, or a capacitor embedded inside the circuit board.

5. The circuit board according to claim 1, wherein
   the at least two passive devices are serially connected between (i) the first signal pad and the second signal pad or (ii) between the test pad and one of the plurality of signal pads, and
   the test pad that is electrically connected (i) to a connection point between the active device and one of the at least two passive devices or (ii) to a connection point between the at least two passive devices.

6. The circuit board according to claim 5, wherein the at least two passive devices include a resistor and a capacitor.

7. A circuit board, comprising:
   an active device embedded inside the circuit board;
   at least one signal pad on a surface of the circuit board;

a plurality of passive devices including at least a first passive device and a second passive device electrically connecting the active device to the at least one signal pad; and a plurality of test pads including at least a first test pad and a second test pad on the surface of the circuit board, wherein the first passive device and the second passive device are connected in series between the active device and the at least one signal pad in this order, and the first test pad is connected to a first connection point between the active device and the first passive device and the second test pad is connected to a second connection point between the first passive device and the second passive device.

8. The circuit board according to claim 7, wherein the active device includes any one of an operational amplifier, a relay, a diode, or a transistor embedded inside the circuit board, and the passive device includes any one of a resistor, an inductor, or a capacitor embedded inside the circuit board.

9. A method of testing a circuit board that includes an active device embedded inside the circuit board, at least one signal pad on a surface of the circuit board, and a plurality of passive devices including at least a first passive device and a second passive device electrically connecting the active device to the at least one signal pad, the first passive device and the second passive device being connected in series between the active device and the at least one signal pad in this order, the method comprising:

forming a plurality of test pads on the circuit board, the plurality of test pads including at least
  a first test pad connected to a first connection point between the active device and the first passive device, and
  a second test pad connected to a second connection point between the first passive device and the second passive device;

testing a connection state of the active device by applying a predetermined current between (i) the at least one signal pad and (ii) the first test pad or the second test pad, and measuring a current or a voltage output from the active device;

testing a connection state of the first passive device by applying a predetermined current between the first test pad and the second test pad, and measuring a voltage across the first test pad and the second test pad; and testing a connection state of the second passive device by applying a predetermined current between the at least one signal pad and the second test pad, and measuring a voltage across the at least one signal pad and the second test pad.

10. The method according to claim 9, wherein the active device includes any one of an operational amplifier, a relay, a diode, or a transistor embedded inside the circuit board, and the passive device includes any one of a resistor, an inductor, or a capacitor embedded inside the circuit board.

* * * * *